United States Patent
Negri et al.

(10) Patent No.: US 11,573,497 B2
(45) Date of Patent: Feb. 7, 2023

(54) SYSTEM AND METHOD FOR MEASURING MISREGISTRATION OF SEMICONDUCTOR DEVICE WAFERS UTILIZING INDUCED TOPOGRAPHY

(71) Applicant: KLA CORPORATION, Milpitas, CA (US)

(72) Inventors: Daria Negri, Nesher (IL); Amnon Manassen, Haifa (IL); Gilad Laredo, Nesher (IL)

(73) Assignee: KLA CORPORATION, Milpitas, CA (US)

( * ) Notice: Subject to any disclaimer, the term of this patent is extended or adjusted under 35 U.S.C. 154(b) by 314 days.

(21) Appl. No.: 16/647,102

(22) PCT Filed: Feb. 14, 2020

(86) PCT No.: PCT/US2020/018202
§ 371 (c)(1),
(2) Date: Mar. 13, 2020

(87) PCT Pub. No.: WO2020/168142
PCT Pub. Date: Aug. 20, 2020

(65) Prior Publication Data
US 2021/0191279 A1    Jun. 24, 2021

Related U.S. Application Data

(60) Provisional application No. 62/870,264, filed on Jul. 3, 2019, provisional application No. 62/864,323, filed (Continued)

(51) Int. Cl.
*G03F 7/20* (2006.01)
*G06T 7/00* (2017.01)

(52) U.S. Cl.
CPC ...... *G03F 7/70633* (2013.01); *G03F 7/70641* (2013.01); *G03F 7/70683* (2013.01); *G06T 7/0004* (2013.01); *G06T 2207/30148* (2013.01)

(58) Field of Classification Search
USPC ................. 382/151, 145; 356/401; 702/95
See application file for complete search history.

(56) References Cited

U.S. PATENT DOCUMENTS 6,819,789 B1 * 11/2004 Kantor ............... H05K 1/0269
                                                        250/559.3
6,988,060 B1 *  1/2006 Coon .................... G03F 9/7076
                                                        356/400

(Continued)

FOREIGN PATENT DOCUMENTS

KR    20180004239 A    1/2018
WO    2009126910 A2    10/2009

(Continued)

OTHER PUBLICATIONS

WIPO, ISR for PCT/US2020/018202, dated Jun. 8, 2020.

*Primary Examiner* — Kathleen Y Dulaney
(74) *Attorney, Agent, or Firm* — Hodgson Russ LLP

(57) ABSTRACT

A system and method of measuring misregistration in the manufacture of semiconductor device wafers is disclosed. A first layer and the second layer are imaged in a first orientation with a misregistration metrology tool employing light having at least one first wavelength that causes images of both the first periodic structure and the second periodic structure to appear in at least two planes that are mutually separated by a perpendicular distance greater than 0.2 µm. The first layer and the second layer are imaged in a second orientation with the misregistration metrology tool employing light having the at least one first wavelength that causes images of both the first periodic structure and the second periodic structure to appear in the at least two planes. At (Continued)

least one parameter of the misregistration metrology tool is adjusted based on the resulting analysis.

20 Claims, 3 Drawing Sheets

Related U.S. Application Data on Jun. 20, 2019, provisional application No. 62/805,737, filed on Feb. 14, 2019.

(56) References Cited

U.S. PATENT DOCUMENTS

| | | | | |
|---|---|---|---|---|
| 6,992,764 | B1* | 1/2006 | Yang | B23K 26/043 |
| | | | | 356/369 |
| 7,009,704 | B1* | 3/2006 | Nikoonahad | G01B 11/272 |
| | | | | 356/399 |
| 7,136,520 | B2* | 11/2006 | Lan | H01L 22/34 |
| | | | | 382/151 |
| 2005/0157296 | A1* | 7/2005 | Hayano | G03F 7/70633 |
| | | | | 356/401 |
| 2006/0151890 | A1* | 7/2006 | Smith | H01L 23/544 |
| | | | | 257/E23.179 |
| 2007/0153253 | A1* | 7/2007 | Van Buel | G03F 7/70716 |
| | | | | 355/72 |
| 2008/0023855 | A1* | 1/2008 | Ghinovker | G06T 7/33 |
| | | | | 257/E23.179 |
| 2009/0046373 | A1* | 2/2009 | Ryzhikov | G03F 7/7085 |
| | | | | 359/663 |
| 2015/0138523 | A1* | 5/2015 | Jak | G03F 7/70483 |
| | | | | 355/72 |
| 2016/0291481 | A1* | 10/2016 | Smilde | G03F 7/70633 |
| 2016/0313654 | A1* | 10/2016 | Zeng | G01B 11/272 |
| 2017/0336198 | A1* | 11/2017 | Adel | G01B 11/272 |
| 2018/0329307 | A1* | 11/2018 | Brinkhof | G03F 9/7092 |
| 2018/0329312 | A1* | 11/2018 | Kuiper | G03F 7/70625 |
| 2019/0219931 | A1* | 7/2019 | Zwier | G03F 7/70633 |
| 2020/0233312 | A1* | 7/2020 | Kim | H01L 21/67259 |

FOREIGN PATENT DOCUMENTS

| | | |
|---|---|---|
| WO | 2016187468 A1 | 11/2016 |
| WO | 2018034908 A1 | 2/2018 |
| WO | 2018187108 A1 | 10/2018 |

* cited by examiner

SYSTEM AND METHOD FOR MEASURING MISREGISTRATION OF SEMICONDUCTOR DEVICE WAFERS UTILIZING INDUCED TOPOGRAPHY

REFERENCE TO RELATED APPLICATIONS

Reference is hereby made to U.S. Provisional Patent Application Ser. No. 62/870,264, filed Jul. 3, 2019 and entitled METHOD OF MEASURING MISREGISTRATION IN THE MANUFACTURE OF TOPOGRAPHIC SEMICONDUCTOR DEVICE WAFERS, and U.S. Provisional Patent Application Ser. No. 62/805,737, filed Feb. 14, 2019 and entitled TARGET DESIGN FOR TOPOGRAPHIC OVERLAY TARGETS, and U.S. Provisional patent Application Ser. No. 62/864,323, filed Jun. 20, 2019 and entitled METHOD FOR MEASURING MISREGISTRATION IN THE MANUFACTURE OF TOPOGRAPHIC SEMICONDUCTOR DEVICE WAFERS, the disclosures of which are hereby incorporated by reference in their entirety and priority of which is hereby claimed.

Reference is also made to the following patents and patent applications of the Applicant, which are related to the subject matter of the present application, the disclosures of which are hereby incorporated by reference:

PCT Patent Publication No. WO 2016/187468 entitled TOPOGRAPHIC PHASE CONTROL FOR OVERLAY MEASUREMENT;

PCT Patent Publication No. WO 2018/034908, entitled SYSTEM AND METHOD FOR GENERATING MULTI-CHANNEL TUNABLE ILLUMINATION FROM A BROAD-BAND SOURCE; and PCT Patent Publication No. WO 2018187108, entitled SYSTEMS AND METHODS FOR METROLOGY WITH LAYER-SPECIFIC ILLUMINATION SPECTRA.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices. In overlay measurement, the misregistration between a previous process layer and a current resist layer is measured. In many targets, such as with 3DNAND and DRAM, the vertical distance between these layers can be several microns.

A double grab was previously performed for overlay measurement. The first layer is imaged in its proper focus in the first grab and the second layer is imaged in its proper focus in the second grab. However, for a double grab to support total measurement uncertainty (TMU) requirements, the focusing mechanism needs to be fully telecentric and the XYZ stages should be noiseless and drift-less. These specifications may be difficult to meet, so specifications typically are relaxed.

In another previous example, the collection numerical aperture (NA) was reduced to increase depth of focus during overlay measurement. However, increasing depth of focus by reducing collection NA reduces a system's resolution and can require a larger pitch and target size increase. Additionally, lower light transmission through the optical system may occur, which reduces throughput.

Improved systems and methods of misregistration measurement are needed.

SUMMARY OF THE INVENTION

The present invention seeks to provide improved methods and systems for measurement of misregistration in the manufacture of semiconductor devices.

There is thus provided in accordance with an embodiment of the present invention a method of measuring misregistration in the manufacture of semiconductor device wafers including providing a multilayered semiconductor device wafer including at least a first layer and a second layer, the wafer including at least one misregistration measurement target formed thereon, the target including a first periodic structure formed together with the first layer and having a first pitch and a second periodic structure formed together with the second layer and having a second pitch, imaging the first layer and the second layer in a first orientation with a misregistration metrology tool employing light having at least one first wavelength that causes images of both the first periodic structure and the second periodic structure to appear in at least two planes that are mutually separated by a perpendicular distance greater than 0.2 µm, analyzing results of the imaging of the first periodic structure and the second periodic structure in the first orientation, thereby generating first analysis results, imaging the first layer and the second layer in a second orientation with the misregistration metrology tool employing light having the at least one first wavelength that causes images of both the first periodic structure and the second periodic structure to appear in the at least two planes, analyzing results of the imaging of the first periodic structure and the second periodic structure in the second orientation, thereby generating second analysis results, thereafter adjusting at least one parameter of the misregistration metrology tool based on the first and second analysis results and thereafter measuring misregistration between the first layer and the second layer.

In accordance with an embodiment of the present invention, the at least one parameter is operative to offset an error in misregistration measurement that is due to poor telecentricity of the misregistration measurement. The at least one parameter includes a setting of a tool-induced-shift knob.

In accordance with an embodiment of the present invention the method also includes calculating a difference between the first analysis results and the second analysis results.

The at least one parameter is adjusted separately for misregistration measured along a first axis and for misregistration measured along a second axis. In accordance with an embodiment of the present invention the first orientation and the second orientation differ by 180 degrees.

In accordance with an embodiment of the present invention, the image of the first periodic structure is a Talbot image. Alternatively, in accordance with an embodiment of the present invention, the image of the first periodic structure is a Talbot image and the image of the second periodic structure is a Talbot image.

In accordance with an embodiment of the present invention, the imaging the first layer and the second layer are performed by a single imager. Alternatively, in accordance with an embodiment of the present invention, the imaging the first layer is performed by a first imager and the imaging of the second layer is performed by a second imager.

In accordance with an embodiment of the present invention, the multilayered semiconductor device wafer includes at least a third layer and the at least one misregistration measurement target includes at least a third periodic structure formed together with the at least third layer and having a third pitch and wherein the method also includes imaging the first layer and the third layer in a first orientation with the misregistration metrology tool employing light having at least one third wavelength that causes images of both the first layer and the third layer to appear in at least two planes that are mutually separated by a perpendicular distance greater than 0.2 µm, analyzing results of the imaging of the first layer and the third layer in the first orientation thereby generating third analysis results, imaging the first layer and the third layer in a second orientation with the misregistration metrology tool employing light having the at least one third wavelength that causes images of both the first layer and the third layer to appear in the at least two planes and analyzing results of the imaging of the first layer and the third layer in the second orientation thereby generating fourth analysis results.

There is also provided in accordance with another embodiment of the present invention a system for measuring misregistration in the manufacture of semiconductor device wafers, the system including at least one imager, imaging in both a first and second orientation at least a first layer and a second layer of a multilayered semiconductor device wafer, the wafer including at least one misregistration measurement target formed thereon, the target including a first periodic structure formed together with the first layer and having a first pitch and a second periodic structure formed together with the second layer and having a second pitch, the at least one imager employing light having at least one first wavelength that causes images of both the first periodic structure and the second periodic structure to appear in at least two planes that are mutually separated by a perpendicular distance greater than 0.2 µm and a parameter adjuster analyzing results of the imaging of the first layer and the second layer in the first orientation, thereby generating first analysis results, analyzing results of the imaging of the first layer and the second layer in the second orientation, thereby generating second analysis results and adjusting at least one parameter of the system based on the analysis results.

BRIEF DESCRIPTION OF THE DRAWINGS

The present invention will be understood and appreciated more fully from the following detailed description, taken in conjunction with the drawings in which.

DETAILED DESCRIPTION

Figure 1:
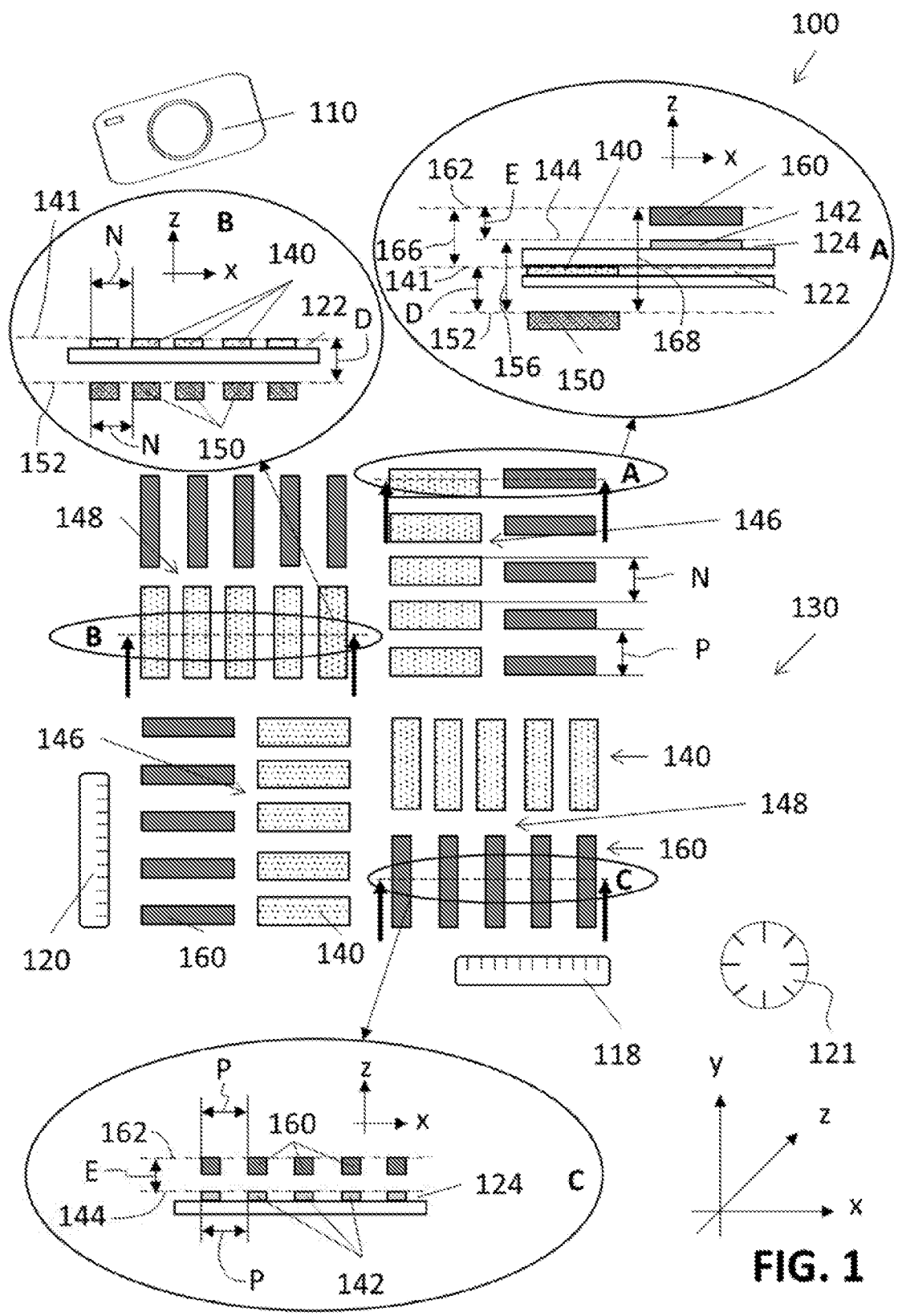
FIG. 1 is a simplified schematic illustration of an embodiment of a system for measuring misregistration in the manufacture of semiconductor device wafers.
Figure 2:
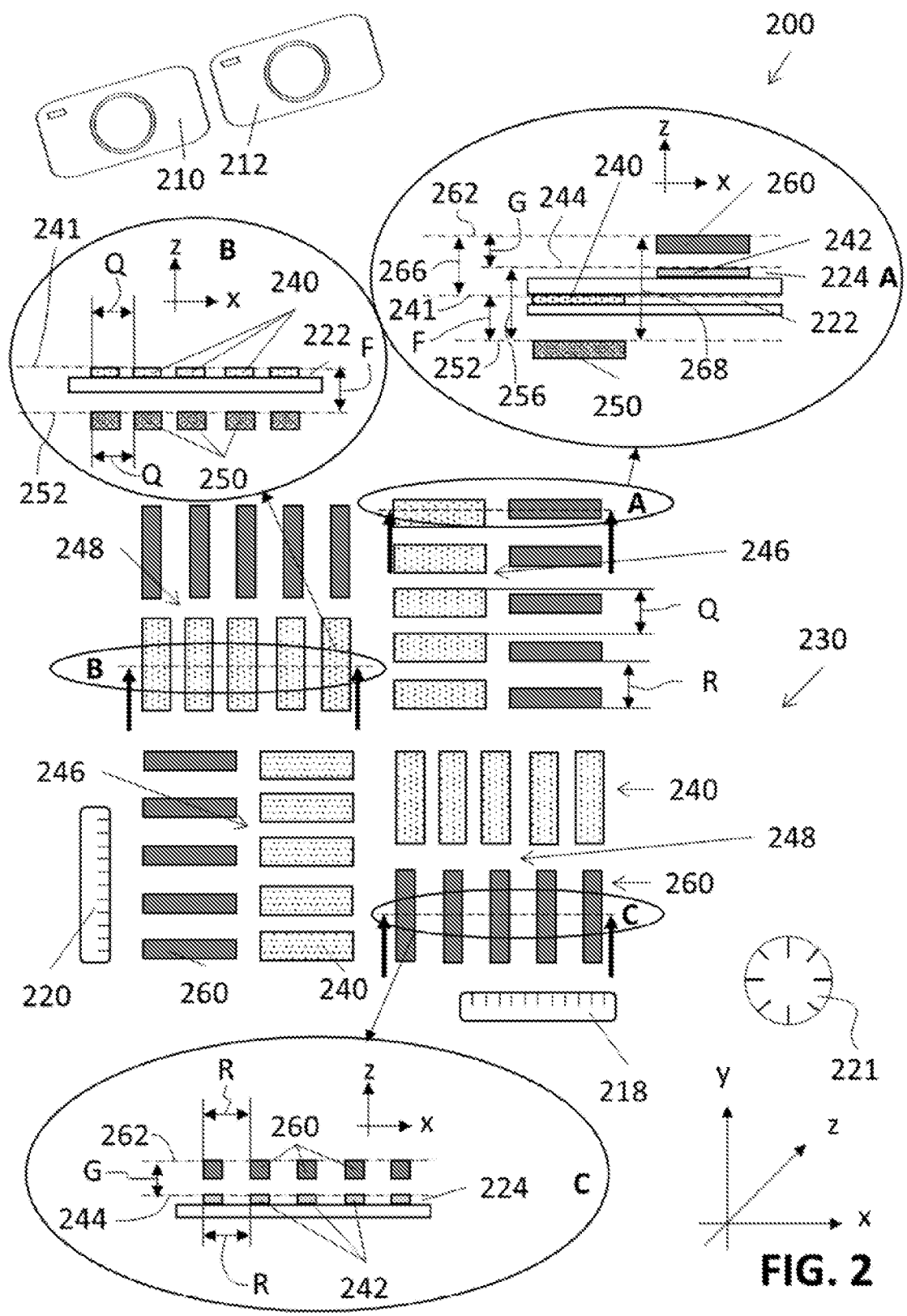
FIG. 2 is a simplified schematic illustration of an additional embodiment of a system for measuring misregistration in the manufacture of semiconductor device wafers.
Figure 3:
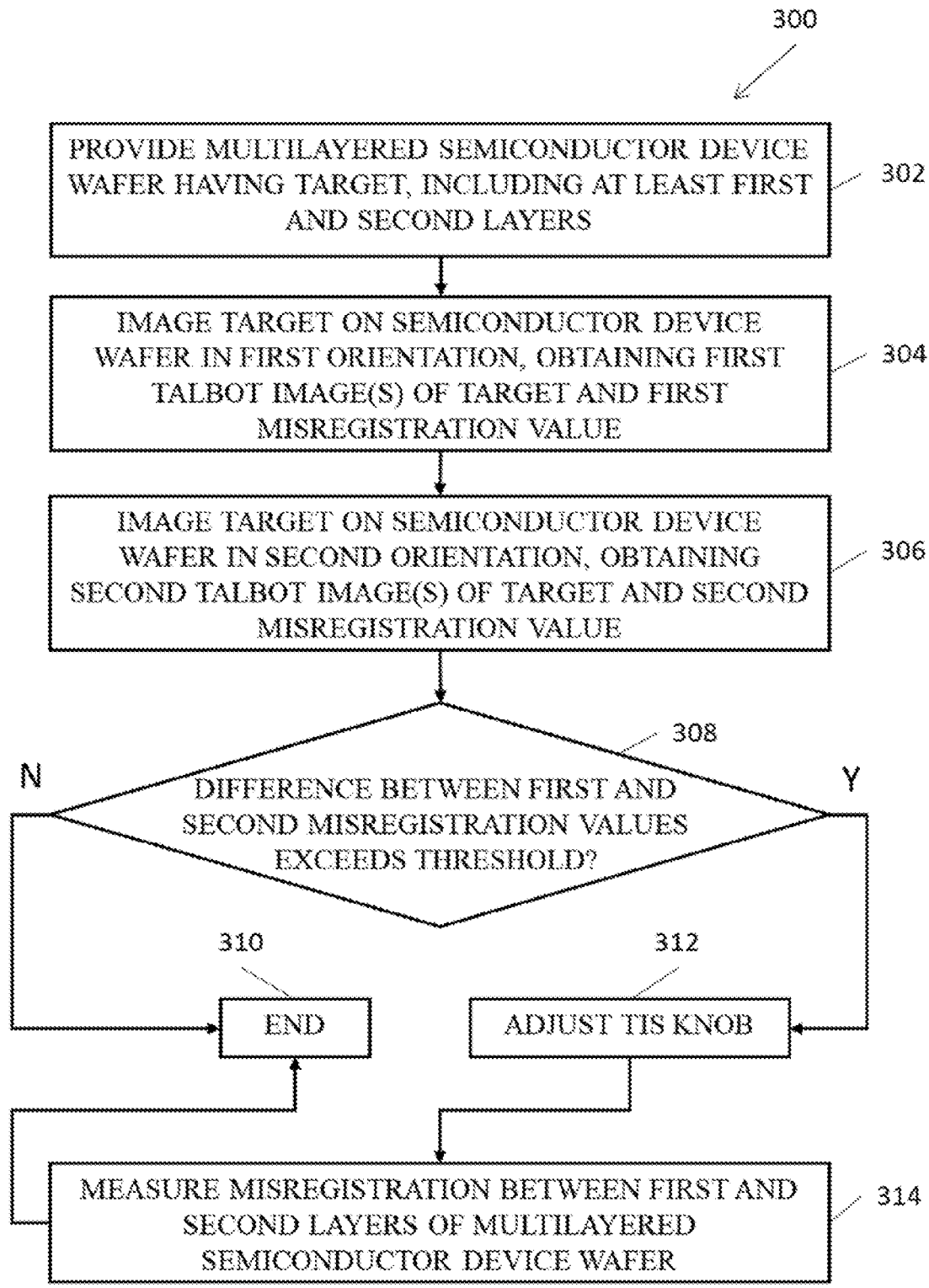
FIG. 3 is a simplified flowchart illustrating a method of measuring misregistration in the manufacture of semiconductor device wafers utilizing either of the systems for measuring misregistration in the manufacture of semiconductor device wafers of FIG. 1 or FIG. 2.

It is appreciated that the system and method described herein with reference to FIGS. 1-3 form part of a manufacturing process for semiconductor devices, and the misregistration measured by the system and method described herein with reference to FIGS. 1-3 is used to adjust fabrication processes of the semiconductor devices to more closely align various layers of the semiconductor devices being fabricated.

Reference is now made to FIGS. 1 and 2, which are simplified schematic illustrations of embodiments of a system for measuring misregistration in the manufacture of semiconductor device wafers. FIG. 1 includes illustrations in three different dimensions, indicated by x-, y- and z-axes, the three dimensions being referred to hereinafter as an x-y plane, an x-z plane and a y-z plane, respectively. It is noted that FIG. 1 generally illustrates the x-y plane, while enlargements A, B and C of FIG. 1 illustrate planes parallel to the x-z plane.

As seen in FIG. 1, in a first embodiment, system 100 includes an imager 110, a first offset quantifier 118 to quantify offset in the x-direction, and a second offset quantifier 120 to quantify offset in the y-direction. It is noted that as used herein, imager 110 is part of an illumination system. A typical imager 110, offset quantifier 118 and offset quantifier 120 are the imager and offset quantifiers included in a misregistration metrology tool, such as the one described in PCT Publication Nos. WO 2016/187468, WO 2018/034908 and WO 2018/187108, the disclosures of which are hereby incorporated by reference. It is noted that imager 110 has a low-illumination numerical aperture, such as below 0.3 or below 0.2.

It is appreciated that, while in the illustrated embodiment shown in FIG. 1, first offset quantifier 118 and second offset quantifier 120 are shown as hardware components and may be implemented as such, they are implemented as software components. It is further noted that system 100 includes a tool-induced-shift (TIS) knob 121, which may be adjusted to offset TIS error in misregistration measurements, particularly TIS error that is due to poor telecentricity of misregistration measurement by system 100. TIS knob 121 can be operative to offset TIS error in the x- and y-directions independently. It is appreciated that, while in the illustrated embodiment shown in FIG. 1, TIS knob 121 is shown as a hardware component and may be implemented as such, it can be implemented as a software component.

Imager 110 is operative to image at least a first layer 122 and a second layer 124 formed on a multilayered semiconductor device wafer including at least one misregistration measurement target 130.

In an instance, the imager 110 can include an illumination source to generate an illumination beam. The illumination beam may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source may further generate an illumination beam including any range of selected wavelengths. In another embodiment, the illumination source may include a spectrally-tunable illumination source to generate an illumination beam having a tunable spectrum.

The imager 110 also may include or be coupled with an illumination pathway, such as an illumination pathway with one or more lenses or additional optical components suitable for modifying and/or conditioning the illumination beam. For example, the one or more optical components may include, but are not limited to, one or more polarizers, one or more filters, one or more beam splitters, one or more diffusers, one or more homogenizers, one or more apodizers, or one or more beam shapers. By way of another example, the one or more optical components may include aperture stops to control the angle of illumination on the sample and/or field stops to control the spatial extent of illumination on the sample. The multilayered semiconductor device wafer can be disposed on a sample stage. The sample stage may include any device suitable for positioning the multilayered semiconductor device wafer. For example, the sample stage may include any combination of linear translation stages, rotational stages, tip/tilt stages or the like.

In another embodiment, the imager 110 includes or is coupled with a detector configured to capture radiation emanating from the multilayered semiconductor device wafer through a collection pathway. For example, the collection pathway may include, but is not limited to, a collection lens (e.g., an objective lens) or one or more additional collection pathway lenses. The collection pathway may further include any number of optical elements to direct and/or modify illumination collected by the objective lens including, but not limited to, one or more collection pathway lenses, one or more filters, one or more polarizers, or one or more beam blocks. Additionally, the collection pathway may include field stops to control the spatial extent of the sample imaged onto the detector or aperture stops to control the angular extent of illumination from the sample used to generate an image on the detector. By way of another example, a detector may receive radiation reflected or scattered (e.g., via specular reflection, diffuse reflection, and the like) from the multilayered semiconductor device wafer. By way of another example, a detector may receive radiation generated by the multilayered semiconductor device wafer (e.g., luminescence associated with absorption of the illumination beam, or the like).

The detector may include any type of optical detector known in the art suitable for measuring illumination received from the multilayered semiconductor device wafer. For example, a detector may include, but is not limited to, a CCD detector, a TD detector, a photomultiplier tube (PMT), an avalanche photodiode (APD), or the like. In another embodiment, a detector may include a spectroscopic detector suitable for identifying wavelengths of radiation emanating from the sample. In another embodiment, the imager 110 may include multiple detectors (e.g., associated with multiple beam paths generated by one or more beamsplitters to facilitate multiple metrology measurements by the imager 110.

It is appreciated that first layer 122 and second layer 124 can be formed such that they are mutually separated by a perpendicular distance in the z-direction of between 0 μm-0.2 μm in an example. The material between first layer 122 and second layer 124 can have an index of refraction, designated n, and is at least partially transparent to photons.

Enlargements A, B and C of FIG. 1 show sectional enlargements of target 130 in planes parallel to the x-z plane. It is noted that other features of the semiconductor device wafer on which target 130 is formed are not shown.

Misregistration measurement target 130 can include a first periodic structure 140 formed together with first layer 122 and characterized by a first pitch, designated N, and lying in a plane 141. Misregistration measurement target 130 further includes a second periodic structure 142 formed together with second layer 124 and characterized by a second pitch, designated P, and lying in a plane 144.

It is appreciated that for the sake of clarity, in FIG. 1, planes 141 and 144 are shown at the top surfaces of first and second layers 122 and 124, respectively; however, planes 141 and 144 may be any planes lying within layers 122 and 124, respectively, that are parallel to the top surfaces of first and second layers 122 and 124, respectively.

It is noted that target 130 can include two periodic structure sets 146 and two periodic structure sets 148, each of periodic structure sets 146 and 148 including both periodic structures 140 and 142. Periodic structure sets 146 and 148 appear in target 130 in different mutually orthogonal orientations, giving target 130 rotational symmetry. In one embodiment of the present invention, other than with respect to their orientation, each of periodic structure sets 146 and 148 may be identical to each other. In another embodiment of the present invention, periodic structures 140 and 142 included in periodic structure set 146 have different pitches than periodic structures 140 and 142 included in periodic structure set 148.

Imager 110 can employ light having at least one wavelength $\lambda_1$ that causes at least one Talbot image 150 of first periodic structure 140 to appear directly underlying first periodic structure 140 in a plane 152, as seen particularly in enlargements A and B of FIG. 1. It is appreciated that since plane 152 is parallel to the x-y plane and Talbot image 150 directly underlies first periodic structure 140 in plane 152, Talbot image 150 is not visible in the central area of FIG. 1, which shows an x-y plane view of target 130.

In an embodiment of the present invention, plane 152 containing Talbot image 150 appears at a perpendicular distance, designated D, in the z-direction from plane 141 due to the Talbot effect. It is appreciated that although in enlargements A and B of FIG. 1, Talbot image 150 is shown as having a thickness, Talbot image 150 has no thickness in the z direction. It is further appreciated that since Talbot image 150 appears directly underlying first periodic structure 140, the offset between second periodic structure 142 and first periodic structure 140, when imaged in one or more x-y planes, is identical to the offset between second periodic structure 142 and Talbot image 150, when imaged in one or more x-y planes.

Perpendicular distance D, between plane 141 of first periodic structure 140 and plane 152 of Talbot image 150, is partially determined by wavelength $\lambda_1$ of light used by imager 110, as well as by pitch N of first periodic structure 140 and by index of refraction n of the material between first periodic structure 140 and Talbot image 150. The relationship between perpendicular distance D, wavelength $\lambda_1$, pitch N and index of refraction n is defined in equation 1:

$$D = \frac{n}{2} \times \frac{\lambda_1}{1 - \sqrt{1 - \left(\frac{\lambda_1}{N}\right)^2}} \qquad \text{(Eq. 1)}$$

In an embodiment of the present invention, pitch N and wavelength $\lambda_1$ are chosen such that planes 152 and 144 are mutually separated by a perpendicular distance 156 in the z-direction that is greater than 0.2 μm, thereby increasing the sensitivity to TIS error of misregistration measurements taken by system 100. In one embodiment of the present invention, imager 110 images target 130 using more than one wavelength of light.

For example, if first layer 122 and second layer 124 are mutually separated by a perpendicular distance of 0.1 μm and index of refraction n of the material between Talbot image 150 and second periodic structure 142 is 1.46, pitch N of first periodic structure 140 is chosen to be 1.0 μm and imager 110 images target 130 with light having at least one wavelength of 800 nm so that plane 152 appears in an x-y plane 1.56 μm below plane 144.

As another example, if first layer 122 and second layer 124 are mutually separated by a perpendicular distance of 0.05 μm and index of refraction n of the material between Talbot image 150 and second periodic structure 142 is 2.0, pitch N of first periodic structure 140 is chosen to be 1.6 μm and imager 110 images target 130 with light having at least one wavelength of 800 nm so that plane 152 appears in an x-y plane 6.05 μm below plane 144.

In the two examples described herein, offset quantifiers 118 and 120 measure offset in the x-direction and y-direction, respectively, between images of Talbot image 150 and second periodic structure 142. Thus, system 100 is operative to capture misregistration data between first layer 122 and second layer 124 that is sensitive to TIS error, and provides useful data for the adjustment of TIS knob 121.

A parameter adjuster can include a module that adjusts the TIS knob 121, which adjusts to offset TIS error in misregistration measurements.

The offset quantifiers 118 and 120 and/or the parameter adjuster can be software components run on one or more processors configured to execute program instructions maintained on a memory medium. In this regard, the one or more processors may execute any of the various process steps described throughout the present disclosure. Further, the processors may be configured to receive data including, but not limited to, metrology data (e.g., alignment measurement results, images of the target, pupil images, and the like) or metrology metrics (e.g., precision, tool-induced shift, sensitivity, diffraction efficiency, and the like). For example, the processors can receive data from the imager 110. The one or more processors may include any processing element known in the art. In this sense, the one or more processors may include any microprocessor-type device configured to execute algorithms and/or instructions. In one embodiment, the one or more processors may be part of a desktop computer, mainframe computer system, workstation, image computer, parallel processor, or any other computer system (e.g., networked computer) configured to execute a program configured to operate imager 110. It is further recognized that the term "processor" may be broadly defined to encompass any device having one or more processing elements, which execute program instructions from a non-transitory memory medium.

Alternatively, imager 10 may employ light having at least one wavelength $\lambda_2$ that causes at least one Talbot image 160 of second periodic structure 142 to appear directly overlying second periodic structure 142 in a plane 162, as seen particularly in enlargements A and C of FIG. 1. It is appreciated that since plane 162 is parallel to the x-y plane and Talbot image 160 directly overlies second periodic structure 142 in plane 162, second periodic structure 142 is not visible in the central area of FIG. 1, which shows an x-y plane view of target 130.

In an embodiment of the present invention, plane 162 containing Talbot image 160 appears at a perpendicular distance, designated E, in the z-direction from plane 144 due to the Talbot effect. It is appreciated that although in enlargements A and C of FIG. 1, Talbot image 160 is shown as having a thickness, Talbot image 160 has no thickness in the z direction. It is further appreciated that since Talbot image 160 appears directly overlying second periodic structure 142, the offset between first periodic structure 140 and second periodic structure 142, when imaged in one or more x-y planes, is identical to the offset between first periodic structure 140 and Talbot image 160, when imaged in one or more x-y planes.

Perpendicular distance E, between plane 144 of second periodic structure 142 and plane 162 of Talbot image 160, is determined by wavelength $\lambda_2$ of light used by imager 110, as well as by pitch P of second periodic structure 142 and by index of refraction n of the material between second periodic structure 142 and Talbot image 160. The relationship between perpendicular distance E, wavelength $\lambda_2$, pitch P and index of refraction n is defined in equation 2:

$$E = \frac{n}{2} \times \frac{\lambda_2}{1 - \sqrt{1 - \left(\frac{\lambda_2}{p}\right)^2}} \quad \text{(Eq. 2)}$$

In an embodiment of the present invention, pitch P and wavelength $\lambda_2$ are chosen such that planes 162 and 141 are mutually separated by a perpendicular distance 166 in the z-direction that is greater than 0.2 μm, thereby increasing the sensitivity to TIS error of misregistration measurements taken by system 100. In one embodiment of the present invention, imager 110 images target 130 using more than one wavelength of light.

For example, if first layer 122 and second layer 124 are mutually separated by a perpendicular distance of 0.15 μm and index of refraction n of the material between first periodic structure 140 and Talbot image 160 is 1.46, pitch P of second periodic structure 142 is chosen to be 1.24 μm and imager 110 images target 130 with light having at least one wavelength of 700 nm so that plane 162 appears in an x-y plane 3.07 μm above plane 141.

As another example, if first layer 122 and second layer 124 are mutually separated by a perpendicular distance of 0.1 μm and index of refraction n of the material between first periodic structure 140 and Talbot image 160 is 2.0, pitch P of second periodic structure 142 is chosen to be 1.0 μm and imager 110 images target 130 with light having at least one wavelength of 800 nm so that plane 162 appears in an x-y plane 2.1 μm above plane 144.

In the two examples described herein, offset quantifiers 118 and 120 measure offset in the x-direction and y-direction, respectively, between images of first periodic structure 140 and Talbot image 160. Thus, system 100 is operative to capture misregistration data between first layer 122 and second layer 124 that is sensitive to TIS error, and provides useful data for the adjustment of TIS knob 121.

In an additional embodiment of the present invention, pitch N and pitch P are chosen such that when imager 110 uses at least one wavelength $\lambda_3$, Talbot images 150 and 160 appear in planes 152 and 162, respectively, which are respective perpendicular distances D and E from first and second layers 122 and 124, respectively. In such a case, perpendicular distances D and E are chosen such that planes 152 and 162 are mutually separated by a perpendicular distance 168 in the z-direction that is greater than 0.2 μm, thereby increasing the sensitivity to TIS error of misregistration measurements taken by system 100.

The relationship between perpendicular distance D, wavelength $\lambda_3$, pitch N and index of refraction n is defined in equation 3:

$$D = \frac{n}{2} \times \frac{\lambda_3}{1 - \sqrt{1 - \left(\frac{\lambda_3}{N}\right)^2}} \quad \text{(Eq. 3)}$$

The relationship between perpendicular distance E, wavelength $\lambda_3$, pitch P and index of refraction n is defined in equation 4:

$$E = \frac{n}{2} \times \frac{\lambda_3}{1 - \sqrt{1 - \left(\frac{\lambda_3}{p}\right)^2}} \quad \text{(Eq. 4)}$$

In one embodiment of the present invention, imager 110 images target 130 using more than one wavelength of light.

For example, if first layer 122 and second layer 124 are mutually separated by a perpendicular distance of 0.1 μm and index of refraction n of the material between Talbot image 150 and Talbot image 160 is 1.46, pitch N of first periodic structure 140 is chosen to be 1.0 μm, pitch P of second periodic structure 142 is chosen to be 1.6 μm, and imager 110 images target 130 with light having a wavelength of 800 nm. Thus, plane 152 appears at a perpendicular distance D of 1.46 μm below first layer 122 and plane 162 appears at a perpendicular distance E of 4.38 μm above second layer 124. Thus, Talbot image 150 and Talbot image 160 are separated by 5.94 μm.

As an additional example, if first layer 122 and second layer 124 are mutually separated by a perpendicular distance of 0.02 μm and index of refraction n of the material between Talbot image 150 and Talbot image 160 is 2.0, pitch N of first periodic structure 140 is chosen to be 1.0 μm, pitch P of second periodic structure 142 is chosen to be 1.6 μm, and imager 110 images target 130 with light having a wavelength of 800 nm. Thus, plane 152 appears at a perpendicular distance D of 2.0 μm below first layer 122 and plane 162 appears at a perpendicular distance E of 6.0 μm above second layer 124.

In the two examples described herein, offset quantifiers 118 and 120 measure offset in the x-direction and y-direction, respectively, between images of Talbot image 150 and Talbot image 160. Thus, system 100 is operative to capture misregistration data between first layer 122 and second layer 124 that is sensitive to TIS error, and provides useful data for the adjustment of TIS knob 121.

It is appreciated that system 100 as described herein with reference to FIG. 1 may also be used in a fabrication process including forming a target having three or more layers. In a case wherein system 100 includes a target having three or more layers, each layer of the target includes one periodic structure formed together with a corresponding layer of the semiconductor device wafer whose misregistration is to be measured. It is noted that such a target can include two periodic structure sets, each periodic structure set including all periodic structures in the target. Each of the two periodic structure sets, forming the target, can be formed in different mutually orthogonal orientations, giving the target rotational symmetry. It is appreciated that other than with respect to their orientation, each of the periodic structure sets may be identical to each other. It is appreciated that the misregistration of any two layers of such a multilayered semiconductor device wafer can be measured by system 100 by comparing the misregistration of the periodic structures on those two layers, as described herein.

Turning now to FIG. 2, it is seen that FIG. 2 includes illustrations in three different dimensions, indicated by x-, y- and z-axes, the three dimensions being referred to hereinafter as an x-y plane, an x-z plane and a y-z plane, respectively. It is noted that FIG. 2 generally illustrates the x-y plane, while enlargements A, B and C of FIG. 2 illustrate planes parallel to the x-z plane.

As seen in FIG. 2, in a first embodiment, system 200 includes a first imager 210, a second imager 212, a first offset quantifier 218 to quantify offset in the x-direction, and a second offset quantifier 220 to quantify offset in the y-direction. It is noted that as used herein, imager 210 is part of an illumination system. A typical first imager 210, second imager 212, offset quantifier 218 and offset quantifier 220 are the imagers and offset quantifiers included in a misregistration metrology tool, such as the one described in PCT Publication Nos. WO 2016/187468, WO 2018/034908 and WO 2018/187108, the disclosures of which are hereby incorporated by reference. It is noted that first imager 210 and second imager 212 both have a low-illumination numerical aperture, such as below 0.3 or below 0.2. The first imager 210 and second imager 212 may be similar to the imager 110. The first offset quantifier 218 and second offset quantifier 220 may be similar to the first offset quantifier 118 and second offset quantifier 120.

It is appreciated that, while in the illustrated embodiment shown in FIG. 2, first offset quantifier 218 and second offset quantifier 220 are shown as hardware components and may be implemented as such, they can be implemented as software components. It is further noted that system 200 includes a tool-induced-shift (TIS) knob 221, which may be adjusted to offset TIS error in misregistration measurements, particularly TIS error that is due to poor telecentricity of misregistration measurement by system 200. TIS knob 221 can be operative to offset TIS error in the x- and y-directions independently. It is appreciated that, while in the illustrated embodiment shown in FIG. 2, TIS knob 221 is shown as a hardware component and may be implemented as such, it can be implemented as a software component.

First imager 210 is operative to image at least a first layer 222 formed on a multilayered semiconductor device wafer including at least one misregistration measurement target 230. Second imager 212 is operative to image at least a second layer 224 formed on a multilayered semiconductor device wafer including at least misregistration measurement target 230.

It is appreciated that first layer 222 and second layer 224 can be formed such that they are mutually separated by a perpendicular distance in the z-direction of between 0 μm-0.2 μm. The material between first layer 222 and second layer 224 can have an index of refraction, designated n, and is at least partially transparent to photons.

Enlargements A, B and C of FIG. 2 show sectional enlargements of target 230 in planes parallel to the x-z plane. It is noted that other features of the semiconductor device wafer on which target 230 is formed are not shown.

Misregistration measurement target 230 can include a first periodic structure 240 formed together with first layer 222 and characterized by a first pitch, designated Q, and lying in a plane 241. Misregistration measurement target 230 further includes a second periodic structure 242 formed together with second layer 224 and characterized by a second pitch, designated R, and lying in a plane 244.

It is appreciated that for the sake of clarity, in FIG. 2, planes 241 and 244 are shown at the top surfaces of first and second layers 222 and 224, respectively; however, planes 241 and 244 may be any planes lying within layers 222 and 224, respectively, that are parallel to the top surfaces of first and second layers 222 and 224, respectively.

It is noted that target 230 can include two periodic structure sets 246 and two periodic structure sets 248, each of periodic structure sets 246 and 248 including both periodic structures 240 and 242. Periodic structure sets 246 and 248 appear in target 230 in different mutually orthogonal orientations, giving target 230 rotational symmetry. In one embodiment of the present invention, other than with respect to their orientation, each of periodic structure sets 246 and 248 may be identical to each other. In another embodiment of the present invention, periodic structures 240 and 242 included in periodic structure set 246 have different pitches than periodic structures 240 and 242 included in periodic structure set 248.

First imager 210 can employ light having at least one wavelength 1 that causes at least one Talbot image 250 of first periodic structure 240 to appear directly underlying first periodic structure 240 in a plane 252, as seen particularly in enlargements A and B of FIG. 2. It is appreciated that since plane 252 is parallel to the x-y plane and Talbot image 250 directly underlies first periodic structure 240 in plane 252, Talbot image 250 is not visible in the central area of FIG. 2, which shows an x-y plane view of target 230.

In an embodiment of the present invention, plane 252 containing Talbot image 250 appears at a perpendicular distance, designated F, in the z-direction from plane 241 due to the Talbot effect. It is appreciated that although in enlargements A and B of FIG. 2, Talbot image 250 is shown as having a thickness, Talbot image 250 has no thickness in the z direction. It is further appreciated that since Talbot image 250 appears directly underlying first periodic structure 240, the offset between second periodic structure 242 and first periodic structure 240, when imaged in one or more x-y planes, is identical to the offset between second periodic structure 242 and Talbot image 250, when imaged in one or more x-y planes.

Perpendicular distance F, between plane 241 of first periodic structure 240 and plane 252 of Talbot image 250, is determined by wavelength of light used by first imager 210, as well as by pitch Q of first periodic structure 240 and by index of refraction n of the material between first periodic structure 240 and Talbot image 250. The relationship between perpendicular distance F, wavelength $\lambda_4$, pitch Q and index of refraction n is defined in equation 5:

$$F = \frac{n}{2} \times \frac{\lambda_4}{1 - \sqrt{1 - \left(\frac{\lambda_4}{Q}\right)^2}} \quad \text{(Eq. 5)}$$

In an embodiment of the present invention, pitch Q and wavelength are chosen such that planes 252 and 244 are mutually separated by a perpendicular distance 256 in the z-direction that is greater than 0.2 µm, thereby increasing the sensitivity to TIS error of misregistration measurements taken by system 200.

For example, if first layer 222 and second layer 224 are mutually separated by a perpendicular distance of 0.1 µm and index of refraction n of the material between Talbot image 250 and second layer 224 is 1.46, pitch Q of first periodic structure 240 is chosen to be 0.58 µm, first imager 210 images first layer 222 with light having at least one wavelength of 500 nm and second imager 212 images second layer 224 with light having any suitable wavelength so that plane 252 appears in an x-y plane 1.1 µm below plane 244.

As another example, if first layer 222 and second layer 224 are mutually separated by a perpendicular distance of 0.07 µm and index of refraction n of the material between Talbot image 250 and second layer 224 is 2.0, pitch Q of first periodic structure 240 is chosen to be 1.0 µm, first imager 210 images first layer 222 with light having at least one wavelength of 600 nm and second imager 212 images second layer 224 with light having any suitable wavelength so that plane 252 appears in an x-y plane 2.26 µm below plane 244.

In the two examples described herein, offset quantifiers 218 and 220 measure offset in the x-direction and y-direction, respectively, between images of Talbot image 250 taken by first imager 210 and second periodic structure 242 taken by second imager 212. Thus, system 200 is operative to capture misregistration data between first layer 222 and second layer 224 that is sensitive to TIS error, and provides useful data for the adjustment of TIS knob 221.

Alternatively, second imager 212 may employ light having at least one wavelength $\lambda_5$ that causes at least one Talbot image 260 of second periodic structure 242 to appear directly overlying second periodic structure 242 in a plane 262, as seen particularly in enlargements A and C of FIG. 2. It is appreciated that since plane 262 is parallel to the x-y plane and Talbot image 260 directly overlies second periodic structure 242 in plane 262, second periodic structure 242 is not visible in the central area of FIG. 2, which shows an x-y plane view of target 230.

In an embodiment of the present invention, plane 262 containing Talbot image 260 appears at a perpendicular distance, designated G, in the z-direction from plane 244 due to the Talbot effect. It is appreciated that although in enlargements A and C of FIG. 2, Talbot image 260 is shown as having a thickness, Talbot image 260 has no thickness in the z direction. It is further appreciated that since Talbot image 260 appears directly overlying second periodic structure 242, the offset between first periodic structure 240 and second periodic structure 242, when imaged in one or more x-y planes, is identical to the offset between first periodic structure 240 and Talbot image 260, when imaged in one or more x-y planes.

Perpendicular distance G, between plane 244 of second periodic structure 242 and plane 262 of Talbot image 260, is determined by wavelength s of light used by second imager 212, as well as by pitch R of second periodic structure 242 and by index of refraction n of the material between second periodic structure 242 and Talbot image 260. The relationship between perpendicular distance G, wavelength $\lambda_5$, pitch R and index of refraction n is defined in equation 6:

$$G = \frac{n}{2} \times \frac{\lambda_5}{1 - \sqrt{1 - \left(\frac{\lambda_5}{R}\right)^2}} \quad \text{(Eq. 6)}$$

In an embodiment of the present invention, pitch R and wavelength 1 are chosen such that planes 262 and 241 are mutually separated by a perpendicular distance 266 in the z-direction that is greater than 0.2 µm, thereby increasing the sensitivity to TIS error of misregistration measurements taken by system 200.

For example, if first layer 222 and second layer 224 are mutually separated by a perpendicular distance of 0.05 µm and index of refraction n of the material between first layer 222 and Talbot image 260 is 1.46, pitch R of second periodic structure 242 is chosen to be 1.2 µm, second imager 212 images second layer 224 with light having at least one wavelength of 550 nm and first imager 210 images first layer 222 with light having any suitable wavelength so that plane 262 appears in an x-y plane 3.7 µm above plane 241.

As another example, if first layer 222 and second layer 224 are mutually separated by a perpendicular distance of 0.1 µm and index of refraction n of the material between first layer 222 and Talbot image 260 is 2.0, pitch R of second periodic structure 242 is chosen to be 1.0 µm, second imager 212 images second layer 224 with light having at least one wavelength of 600 nm and first imager 210 images first layer 222 with light having any suitable wavelength so that plane 262 appears in an x-y plane 3.1 µm above plane 241.

In the two examples described herein, offset quantifiers 218 and 220 measure offset in the x-direction and y-direction, respectively, between images of Talbot image 260 taken by second imager 212 and first periodic structure 240 taken by first imager 210. Thus, system 200 is operative to capture misregistration data between first layer 222 and second layer 224 that is sensitive to TIS error, and provides useful data for the adjustment of TIS knob 221.

In an additional embodiment of the present invention, pitch Q and pitch R are chosen such that when first imager 210 uses a wavelength $\lambda_4$ and second imager 212 uses a wavelength $\lambda_5$, Talbot images 250 and 260 appear in planes 252 and 262, respectively, which are respective perpendicular distances F and G from first and second layers 222 and 224, respectively. In such a case, perpendicular distances F and G are chosen such that planes 252 and 262 are mutually separated by a perpendicular distance 268 in the z-direction that is greater than 0.2 µm, thereby increasing the sensitivity to TIS error of misregistration measurements taken by system 200.

For example, if first layer 222 and second layer 224 are mutually separated by a perpendicular distance of 1.0 µm and index of refraction n of the material between Talbot image 250 and Talbot image 260 is 1.46, pitch Q of first periodic structure 240 is chosen to be 0.58 µm, pitch R of second periodic structure 242 is chosen to be 1.24 µm, first imager 210 images first layer 222 with light having a wavelength of 500 nm and second imager 212 images second layer 224 with light having a wavelength of 700 nm. Thus, plane 252 appears at a perpendicular distance F of 0.73 µm below first layer 222 and plane 262 appears at a perpendicular distance G of 2.92 µm above second layer 224.

As an additional example, if first layer 222 and second layer 224 are mutually separated by a perpendicular distance of 1.5 µm and index of refraction n of the material between Talbot image 250 and Talbot image 260 is 2.0, pitch Q of first periodic structure 240 is chosen to be 1.24 µm, pitch R of second periodic structure 242 is chosen to be 1.2 µm, first imager 210 images first layer 222 with light having a wavelength of 700 nm and second imager 212 images second layer 224 with light having a wavelength of 550 nm. Thus, plane 252 appears at a perpendicular distance F of 4.0 µm below first layer 222, and plane 262 appears at a perpendicular distance G of 5.0 µm above second layer 224.

In the two examples described herein, offset quantifiers 218 and 220 measure offset in the x-direction and y-direction, respectively, between images of Talbot image 250 taken by first imager 210 and of Talbot image 260 taken by second imager 212. Thus, system 200 is operative to capture misregistration data between first layer 222 and second layer 224 that is sensitive to TIS error, and provides useful data for the adjustment of TIS knob 221.

It is appreciated that system 200 as described herein with reference to FIG. 2 may also be used in a fabrication process including forming a target having three or more layers. In a case wherein system 200 includes a target having three or more layers, each layer of the target includes one periodic structure formed together with a corresponding layer of the semiconductor device wafer whose misregistration is to be measured. It is noted that such a target can include two periodic structure sets, each periodic structure set including all periodic structures in the target. Each of the two periodic structure sets, forming the target, can be formed in different mutually orthogonal orientations, giving the target rotational symmetry. It is appreciated that other than with respect to their orientation, each of the periodic structure sets may be identical to each other. It is appreciated that the misregistration of any two layers of such a multilayered semiconductor device wafer can be measured by system 200 by comparing the misregistration of the periodic structures on those two layers, as described herein.

Reference is now made to FIG. 3, which is a simplified flowchart illustrating a method 300 of measuring misregistration in the manufacture of semiconductor device wafers utilizing either of systems 100 or 200 for measuring misregistration in the manufacture of semiconductor device wafers, as described herein with reference to FIGS. 1 and 2.

As seen at a first step 302, a multilayered semiconductor device wafer having at least one suitable target, such as target 130 or 230, is provided. A suitable target can include at least a first periodic structure formed together with a first layer of the multilayered semiconductor device wafer having a first pitch, and a second periodic structure formed together with a second layer of the multilayered semiconductor device wafer having a second pitch. Similarly, a target having three or more layers, as described herein with reference to alternate embodiments of FIGS. 1 and 2, may be provided.

As seen at a next step 304, the target provided in step 302 is imaged in a first orientation. As described herein with reference to FIGS. 1 and 2, in an embodiment of the present invention, characteristics of the target and the light used to image the target are chosen such that at least one Talbot image of at least one layer of the target appears in a plane that is separated from an image of the other layer of the target by a perpendicular distance greater than 0.2 µm.

Also at step 304, the results of the imaging performed at step 304 are analyzed, which can generate first analysis results including a first misregistration value between the first and second layers of the semiconductor device wafer.

Following step 304, at a next step 306, the target provided in step 302 is imaged in a second orientation. The second orientation may differ from the first orientation of step 304 by 180 degrees rotation in an x-y plane. As described herein with reference to FIGS. 1 and 2, in an embodiment of the present invention, characteristics of the target and the light used to image the target are chosen such that at least one Talbot image of at least one layer of the target appears in a plane that is separated from an image of the other layer of the target by a perpendicular distance greater than 0.2 µm.

Also at step 306, the results of the imaging performed at step 306 are analyzed, which generates second analysis results including a second misregistration value between the first and second layers of the semiconductor device wafer.

At a next step 308, the first and second misregistration values generated at steps 304 and 306, respectively, are compared. If a difference between the first and second misregistration values does not exceed a pre-determined threshold, method 300 ends at a next step 310.

Third and fourth analysis results can be generated from analysis of the first layer and the third layer in a first orientation or second orientation, respectively. The third and fourth analysis results may be similar to the first and second analysis results.

If the difference between the first and second misregistration values does exceed a pre-determined threshold, method 30 proceeds to a next step 312, at which TIS knob 121 or 221 is adjusted to offset TIS error in misregistration measurements, as indicated by the difference between the first and second misregistration values, such as using a parameter adjuster. Specifically, the adjustment of TIS knob 121 or 221 at step 312 offsets TIS error that is due to poor telecentricity of misregistration measurement by system 100 or 200. TIS knob 121 can be adjusted to offset TIS error in the x- and y-directions independently. It is appreciated that by adjusting TIS knob 121 or 221, at least one parameter of system 100 or 200 is adjusted.

Following step 312, at a next step 314, system 100 or 200 can measure misregistration of the multilayered semiconductor device wafer provided at step 302. In another embodiment of the present invention, at a next step 314, system 100 or 200 measures misregistration of multilayered semiconductor device wafer intended to be identical to the multilayered semiconductor device wafer provided at step 302 Following step 314, method 300 may end at step 310.

It will be appreciated by persons skilled in the art that the present invention is not limited to what has been particularly shown and described herein. The scope of the present invention includes both combinations and sub combinations of various features described herein as well as modifications thereof, all of which are not in the prior art.

The invention claimed is:

1. A method of measuring misregistration to manufacture semiconductor device wafers comprising:
   providing a multilayered semiconductor device wafer comprising at least a first layer and a second layer, said wafer including at least one misregistration measurement target formed thereon, said target including a first periodic structure formed together with said first layer and having a first pitch and a second periodic structure formed together with said second layer and having a second pitch;
   imaging said first layer and said second layer in a first orientation with a misregistration metrology tool employing light having at least one first wavelength that causes an image of said first periodic structure and an image of said second periodic structure to appear in at least two planes that are mutually separated by a perpendicular distance greater than 0.2 µm;
   analyzing results of said imaging of said first periodic structure and said second periodic structure in said first orientation thereby generating first analysis results;
   imaging said first layer and said second layer in a second orientation with said misregistration metrology tool employing light having said at least one first wavelength that causes images of both said first periodic structure and said second periodic structure to appear in said at least two planes;
   analyzing results of said imaging of said first periodic structure and said second periodic structure in said second orientation thereby generating second analysis results;
   thereafter adjusting at least one parameter of said misregistration metrology tool using a parameter adjuster based on said first and second analysis results, wherein said at least one parameter comprises a setting of a tool-induced-shift knob; and
   thereafter measuring misregistration between said first layer and said second layer.

2. The method of measuring misregistration according to claim 1, wherein said at least one parameter is operative to offset an error in misregistration measurement that is due to poor telecentricity of said misregistration measurement.

3. The method of measuring misregistration according to claim 1, further comprising calculating a difference between said first analysis results and said second analysis results.

4. The method of measuring misregistration according to claim 1, wherein said at least one parameter is adjusted separately for misregistration measured along a first axis and for misregistration measured along a second axis.

5. The method of measuring misregistration according to claim 1, wherein said first orientation and said second orientation differ by 180 degrees.

6. The method of measuring misregistration according to claim 1, wherein said image of said first periodic structure is a Talbot image.

7. The method of measuring misregistration according to claim 1, wherein said image of said first periodic structure is a Talbot image and said image of said second periodic structure is a Talbot image.

8. The method of measuring misregistration according to claim 1, wherein said imaging said first layer and said second layer are performed by a single imager.

9. The method of measuring misregistration according to claim 1, wherein said imaging said first layer is performed by a first imager and said imaging of said second layer is performed by a second imager.

10. The method of measuring misregistration according to claim 1, wherein said multilayered semiconductor device wafer comprises at least a third layer and said at least one misregistration measurement target comprises at least a third periodic structure formed together with said at least third layer and having a third pitch and wherein said method further comprises:
   imaging said first layer and said third layer in said first orientation with said misregistration metrology tool employing light having at least one third wavelength that causes images of both said first layer and said third layer to appear in said at least two planes that are mutually separated by a perpendicular distance greater than 0.2 µm;
   analyzing results of said imaging of said first layer and said third layer in said first orientation thereby generating third analysis results;
   imaging said first layer and said third layer in said second orientation with said misregistration metrology tool employing light having said at least one third wavelength that causes images of both said first layer and said third layer to appear in said at least two planes; and
   analyzing results of said imaging of said first layer and said third layer in said second orientation thereby generating fourth analysis results.

11. A system for measuring misregistration to manufacture semiconductor device wafers, the system comprising:
   at least one imager configured to image in both a first and second orientation at least a first layer and a second layer of a multilayered semiconductor device wafer, said wafer comprising at least one misregistration measurement target formed thereon, said target comprising a first periodic structure formed together with said first layer and having a first pitch and a second periodic structure formed together with said second layer and having a second pitch, said at least one imager employing light having at least one first wavelength that causes an image of said first periodic structure and an image of said second periodic structure to appear in at least two planes that are mutually separated by a perpendicular distance greater than 0.2 µm; and
   a parameter adjuster configured to:

analyze results of imaging of said first layer and said second layer in said first orientation, thereby generating first analysis results;

analyze results of imaging of said first layer and said second layer in said second orientation, thereby generating second analysis results; and adjust at least one parameter of said system based on said results of said first orientation and said second orientation, wherein said at least one parameter comprises a setting of a tool-induced-shift knob.

12. The system for measuring misregistration according to claim 11, wherein said at least one parameter is operative to offset an error in misregistration measurement that is due to poor telecentricity of said system during misregistration measurement.

13. The system for measuring misregistration according to claim 11, wherein said parameter adjuster is also operative to calculate a difference between said first analysis results and said second analysis results.

14. The system for measuring misregistration according to claim 11, wherein said parameter adjuster adjusts said at least one parameter separately for misregistration measured along a first axis and for misregistration measured along a second axis.

15. The system for measuring misregistration according to claim 11, wherein said first orientation and said second orientation differ by 180 degrees.

16. The system for measuring misregistration according to claim 11, wherein said image of said first periodic structure is a Talbot image.

17. The system for measuring misregistration according to claim 11, wherein said image of said first periodic structure is a Talbot image and said image of said second periodic structure is a Talbot image.

18. The system for measuring misregistration according to claim 11, wherein said at least one imager comprises a single imager.

19. The system for measuring misregistration according to claim 11, wherein said at least one imager comprises a first imager configured to image said first layer and a second imager configured to image said second layer.

20. The system for measuring misregistration according to claim 11, wherein said multilayered semiconductor device wafer comprises at least a third layer and said at least one misregistration measurement target comprises at least a third periodic structure formed together with said at least third layer and having a third pitch and wherein:

said imager configured to image at least said first layer and said third layer of said multilayered semiconductor device wafer in both a first and second orientation, said imager employing light having at least one third wavelength that causes images of both said first periodic structure and said third periodic structure to appear in at least two planes that are mutually separated by a perpendicular distance greater than 0.2 µm; and said parameter adjuster analyzes results of said images of said first periodic structure and said third periodic structure, thereby generating analysis results and adjusting at least one parameter of said system based on said analysis results of said first periodic structure and said third periodic structure.

* * * * *